(12) United States Patent
Eitschberger et al.

(10) Patent No.: US 11,053,778 B2
(45) Date of Patent: Jul. 6, 2021

(54) INSPECTION TOOL FOR A PERFORATING GUN SEGMENT

(71) Applicant: DynaEnergetics Europe GmbH, Troisdorf (DE)

(72) Inventors: Christian Eitschberger, Munich (DE); Stefan Volberg, Troisdorf (DE)

(73) Assignee: DynaEnergetics Europe GmbH, Troisdorf (DE)

( * ) Notice: Subject to any disclaimer, the term of this patent is extended or adjusted under 35 U.S.C. 154(b) by 0 days.

(21) Appl. No.: 16/783,858

(22) Filed: Feb. 6, 2020

(65) Prior Publication Data

US 2020/0173259 A1 Jun. 4, 2020

Related U.S. Application Data

(63) Continuation of application No. 16/568,503, filed on Sep. 12, 2019, now Pat. No. 10,597,979.

(Continued)

(51) Int. Cl.
*E21B 41/00* (2006.01)
*G01R 31/12* (2020.01)
(Continued)

(52) U.S. Cl.
CPC ............. *E21B 41/00* (2013.01); *G01R 27/18* (2013.01); *G01R 27/205* (2013.01); *G01R 31/1272* (2013.01); *E21B 43/117* (2013.01)

(58) Field of Classification Search
CPC ...... G01R 31/1272; G01R 27/18; E21B 41/00
See application file for complete search history.

(56) References Cited

U.S. PATENT DOCUMENTS 4,591,226 A 5/1986 Hargett et al.
4,630,243 A 12/1986 MacLeod
(Continued)

FOREIGN PATENT DOCUMENTS

CN 100526601 C 8/2009
CN 201765276 U 3/2011
(Continued)

OTHER PUBLICATIONS

International Searching Authority, International Search Report and Written Opinion of International App. No. PCT/EP2019/074433, which is in the same family as U.S. Appl. No. 16/568,503, dated Dec. 5, 2019, 14 pgs.

(Continued)

*Primary Examiner* — Dominic E Hawkins
(74) *Attorney, Agent, or Firm* — Moyles IP, LLC

(57) ABSTRACT

An inspection tool and associated methods for testing physical and electrical properties of a perforating gun segment, wherein the perforating gun segment is received in a perforating gun segment holder positioned between a first connecting portion and second connecting portion. The inspection tool may be for establishing, testing, and confirming the position of an internal gun assembly and the electrical properties of certain electrical connections of the perforating gun segment. Electrical testing contacts and/or distance sensors may be positioned on one of the first connecting portion and the second connecting portion for measuring the position of the internal gun assembly and the electrical properties. In an aspect, the inspection tool may include a piston for pushing, via the first connecting portion, the internal gun assembly to a predetermined position, and establishing electrical connections to test the electrical properties of the perforating gun segment.

20 Claims, 4 Drawing Sheets

Related U.S. Application Data

(60) Provisional application No. 62/732,424, filed on Sep. 17, 2018.

(51) Int. Cl.
  *G01R 27/20* (2006.01)
  *G01R 27/18* (2006.01)
  *E21B 43/117* (2006.01)

(56) References Cited

U.S. PATENT DOCUMENTS

| | | | |
|---|---|---|---|
| 6,006,833 | A | 12/1999 | Burleson et al. |
| 6,820,693 | B2 | 11/2004 | Hales et al. |
| 7,565,927 | B2 | 7/2009 | Gerez et al. |
| 8,695,506 | B2 | 4/2014 | Lanclos |
| 8,869,887 | B2 | 10/2014 | Deere et al. |
| 9,194,219 | B1 * | 11/2015 | Hardesty ................ F42D 1/055 |
| 9,677,573 | B2 | 6/2017 | Jaffrey |
| 2002/0002015 | A1 | 1/2002 | Mochizuki et al. |
| 2008/0173083 | A1 | 7/2008 | Kasperski et al. |
| 2010/0133004 | A1 | 6/2010 | Burleson et al. |
| 2012/0037365 | A1 * | 2/2012 | Torres ................... E21B 43/119 |
| | | | 166/297 |
| 2012/0181012 | A1 * | 7/2012 | Strickland ............ E21B 43/116 |
| | | | 166/55 |
| 2012/0199397 | A1 | 8/2012 | Wessling et al. |
| 2013/0168083 | A1 * | 7/2013 | McCarter ................ E21B 23/00 |
| | | | 166/250.01 |
| 2016/0216387 | A1 | 7/2016 | Fullerton et al. |
| 2016/0356132 | A1 * | 12/2016 | Burmeister ........... E21B 43/119 |
| 2017/0032653 | A1 | 2/2017 | Crawford et al. |
| 2017/0184383 | A1 | 6/2017 | Lee |
| 2017/0184384 | A1 | 6/2017 | Kim |
| 2017/0342821 | A1 | 11/2017 | Shen et al. |
| 2019/0085685 | A1 * | 3/2019 | McBride ................ E21B 43/114 |

FOREIGN PATENT DOCUMENTS

| | | |
|---|---|---|
| CN | 204329720 U | 5/2015 |
| WO | 2012106636 A2 | 8/2012 |

OTHER PUBLICATIONS

DynaEnergetics, DynaEnergetics Infinity Surface Tester, dated Apr. 26, 2018, 1 pg., https://www.dynastage.com/-/media/Project/DMC/DynaEnergetics/Technical-Data-Sheets---PDF/J200_DynaEnergetics_Infinity_Surface_Tester_183101.

United States Patent and Trademark Office; Notice of Allowance for U.S. Appl. No. 16/568,503; dated Nov. 8, 2019; 11 pages.

International Searching Authority; International Preliminary Report on Patentability of the International Searching Authority for PCT/EP2019/074433; dated Mar. 9, 2021; 9 pages.

* cited by examiner

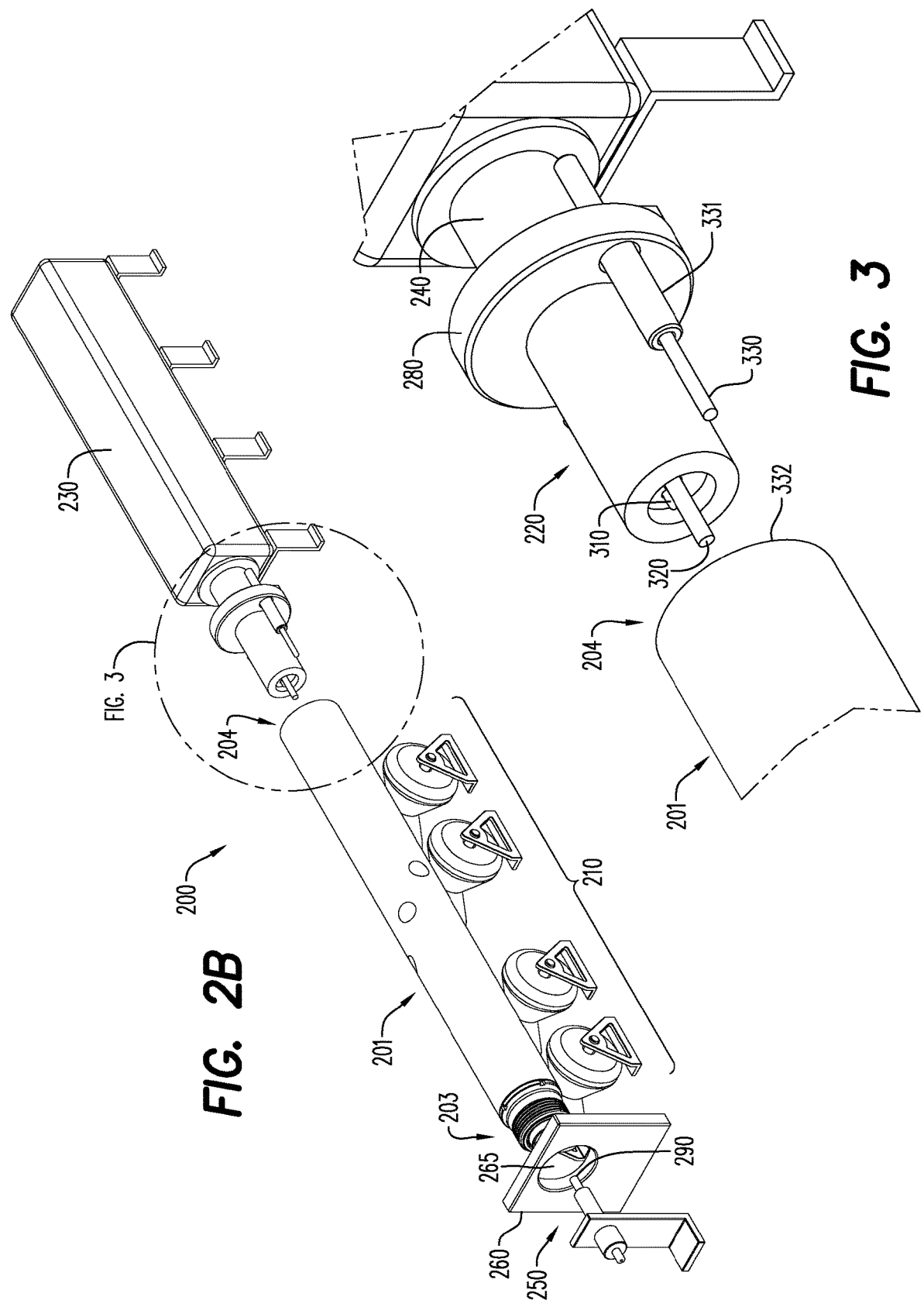

INSPECTION TOOL FOR A PERFORATING GUN SEGMENT

CROSS-REFERENCE TO RELATED APPLICATIONS

This application is a continuation of and claims priority to U.S. patent application Ser. No. 16/568,503 filed Sep. 12, 2019, which claims the benefit of U.S. Provisional Patent Application No. 62/732,424 filed Sep. 17, 2018. The entire contents of the applications listed above are incorporated herein by reference.

BACKGROUND OF THE DISCLOSURE

Downhole operations in oil and gas wells typically involve, among other things, deploying one or more perforating guns into the wellbore to perforate wellbore casing and tubing and surrounding hydrocarbon-bearing formations to liberate and collect oil and gas within the formations. Once a perforating gun is deployed into a wellbore to a desired position, shaped charges that the perforating gun carries are detonated to create the desired perforations. Accordingly, a typical perforating gun includes, among other things, electrical connections for receiving a detonation signal and initiating detonating components such as a detonator and a detonating cord for ballistically detonating the shaped charges. An exemplary perforating gun is described below with reference to FIG. 1.

As shown in FIG. 1, the perforating gun 100 includes a gun carrier 110 having a top end 101 and a bottom end 102 opposite the top end 101. The gun carrier 110 is typically a cylindrical metal body that isolates a charge carrier 141 from, among other things, wellbore fluid that is pumped under high hydraulic pressure into the wellbore to further open the perforations and create further cracks and flow paths in the hydrocarbon-bearing formation for the recovery of oil and gas. The wellbore fluid may damage or render inoperable internal components of the perforating gun 100 if the wellbore fluid infiltrates a hollow interior 130 of the gun carrier 110 in which the various internal components are housed, and the wellbore fluid pressure may cause pinching of explosives within the perforating gun 100. The various internal components of the perforating gun 100 may be arranged as an internal gun assembly 140 including the charge carrier 141. The charge carrier 141 may have a shape and features designed to orient and/or retain the various internal components such as the shaped charges 142, a detonating cord 143, an electrically conductive line/electrically conductive through wire 144, and a ground contact 145 (in FIG. 1, the ground contact is shown as a ground bar). The charge carrier 141 may be, for example, an injection molded structure.

Multiple connected perforating guns ("perforating gun segments") are often deployed into the wellbore as a perforating gun string to improve operational efficiency by allowing multiple perforating intervals to be performed during a single deployment (run) into the wellbore. As would be readily apparent to one of ordinary skill in the art from the following disclosure, the disclosure is in no way limited to a perforating gun segment viz-a-viz multiple connected perforating guns and may apply to any perforating gun in a manner consistent with the disclosure. As described throughout the disclosure, a perforating gun segment may include, among other things and as discussed above with respect to known perforating guns, generally, an assembly of components such as a gun carrier 110 and an internal gun assembly 140 including a charge carrier 141 and various internal components such as shaped charges 142, a detonating cord 143, an electrically conductive line/electrically conductive through wire 144, and a ground contact 145.

With continuing reference to FIG. 1, the top end 101 of the gun carrier 110 may be connected to an upstream gun carrier 102' (only the connecting portion of the upstream gun carrier 102'/perforating gun segment is shown in FIG. 1) and the bottom end 102 of the gun carrier 110 may be connected to a downstream gun carrier 101' (only the connecting portion of the downstream gun carrier 101'/perforating gun segment is shown in FIG. 1) by virtue of respective tandem sub connectors 151 that threadingly connect on opposite sides (as described below) of the tandem sub connector 151 to complimentary threaded portions on each of the successive gun carriers 110, 101', 102'. For purposes of this disclosure, "downstream" means further into the wellbore and "upstream" means further towards the surface of the wellbore. Electrical signals relayed by, e.g., the conductive line 144 may be transferred between successive gun segments as described below.

In an example shown in FIG. 1 at the bottom end 102 of the perforating gun 100, a first side 152 of the tandem sub 151 connects to the gun carrier 110 of the illustrated perforating gun 100 while a second side 153 of the tandem sub 151 connects to the gun carrier 101' of the downstream perforating gun. An enlarged circumferential portion 154 of the tandem sub 151 provides a seal between the successive perforating guns. A pressure bulkhead 150 with an electrical feedthrough is housed within the tandem sub 151 and may provide an electrical connection between respective conductive lines in each of the successive perforating guns and/or between a conductive line of the upstream perforating gun and a detonator 155 of the downstream perforating gun. The conductive line 144 may relay an electrical signal along a length L of the perforating gun segment 100 from a top bulkhead feedthrough connection 156 to a bottom bulkhead feedthrough connection 157 and thereby to a successive perforating gun segment for, among other things, initiating selective detonation of a particular perforating gun segment by, e.g., providing a coded digital signal to arm the particular perforating gun segment and an electrical input to activate the detonator of that perforating gun segment and thereby initiate the associated detonating cord. For purposes of this disclosure, "selective detonation" means that each perforating gun in the gun string may be detonated individually and at different times, for example, when a digital signal corresponding to a particular perforating gun segment is received at that perforating gun segment. In use, the perforating gun segments in the gun string must be detonated in a "bottom-up" fashion—i.e., the furthest downstream perforating gun at each interval must be detonated before the others—otherwise the conductive line will be severed between remaining perforating guns.

In view of at least the above considerations, mechanical dimensions and electrical performance must be within tight tolerances to ensure safe and reliable operation of perforating gun segments in gun strings. For example, the position of the internal gun assembly 140 must be precisely set to make proper electrical contact with, e.g., the feedthrough bulkheads 150. In addition, reliable electrical and ground connections and feedthrough properties of conductive components are critical for ensuring that an electrical signal is safely and effectively relayed between contact points on opposing ends of the perforating gun segment. Accordingly, these and other properties of a perforating gun segment may be tested/verified to particular quality specifications before the perforating gun segment is shipped. Typical methods for conducting such measurements may include, for example, manually or digitally measuring physical dimensions of the perforating gun segment and sequentially attaching electrical leads to different electrical (and related) components to measure various electrical properties and logging the results individually. The typical processes may be slow, labor intensive, and susceptible to human error.

For at least the above reasons, devices, systems, and methods are needed for efficiently and accurately measuring and logging physical dimensions and electrical properties of a perforating gun segment.

BRIEF DESCRIPTION OF THE EXEMPLARY EMBODIMENTS

The disclosure relates generally to an inspection tool for a perforating gun segment, comprising a first connecting portion, a second connecting portion positioned opposite the first connecting portion in a spaced apart relationship from the first connecting portion, and a perforating gun segment holder positioned between the first connecting portion and the second connecting portion and configured for receiving and retaining a perforating gun segment between the first connecting portion and the second connecting portion. The inspection tool may be used for establishing, testing, and confirming, without limitation, the position of an internal gun assembly of the perforating gun segment within the gun carrier and certain electrical properties of the perforating gun segment. Accordingly, in an aspect, an electrical testing contact or a distance sensor positioned may be positioned on at least one of the first connecting portion and the second connecting portion. The electrical testing contact or the distance sensor may be respectively positioned for making electrical contact with an electrical contact component of the perforating gun segment or physical contact with a distance sensor contact point on the perforating gun segment, when the perforating gun segment is received in the perforating gun segment holder.

The disclosure also relates generally to a method for measuring electrical properties and dimensions of a perforating gun segment, and comprises, among other things, positioning the perforating gun segment between a first connecting portion and a second connecting portion such that an electrical testing contact or a distance sensor positioned on at least one of the first connecting portion and the second connecting portion may be respectively positioned for making electrical contact with an electrical contact component of the perforating gun segment or physical contact with a distance sensor contact point on the perforating gun segment. In an aspect, the method may also include actuating the first connecting portion to move from a first position to a second position, wherein the electrical testing contact or the distance sensor is respectively in electrical contact with the electrical contact component of the perforating gun segment or in physical contact with the distance sensor contact point when the first connecting portion is in the second position.

In a further aspect, the method may include measuring one of an electrical property of the perforating gun segment when the first electrical testing contact is in electrical contact with the electrical contact component or a distance that the first connecting portion travels after the distance sensor contacts the distance sensor contact point.

The disclosure also relates generally to a method for measuring electrical properties and dimensions of a perforating gun segment, comprising positioning the perforating gun segment between a first connecting portion and a second connecting portion, wherein the first connecting portion includes a first electrical testing contact and the second connecting portion includes a second electrical testing contact, and a distance sensor is positioned on at least one of the first connecting portion and the second connecting portion. In an aspect, the method may include actuating the first connecting portion to move from a first position to a second position, wherein, during the first connecting portion moving from the first position to the second position, the distance sensor contacts a distance sensor contact point on the perforating gun segment and the first electrical testing contact electrically contacts a first end of a feedthrough conductor of an internal gun assembly within a gun carrier of the perforating gun segment.

The method may then further include pushing with the first connecting portion the internal gun assembly to a predetermined position within the gun carrier, wherein the distance sensor measures a distance that the first connecting portion travels from the first position to the second position after the distance sensor contacts the distance sensor contact point, and the predetermined position of the internal gun assembly corresponds to a preset distance that the first connecting portion travels after the distance sensor contacts the distance sensor contact point. In a further aspect, the second electrical testing contact may electrically contact a second end of the feedthrough conductor when the internal gun assembly is in the predetermined position, and the method may further include measuring a feedthrough resistance of the feedthrough conductor.

BRIEF DESCRIPTION OF THE DRAWINGS

A more particular description will be rendered by reference to specific exemplary embodiments thereof that are illustrated in the appended drawings. Understanding that these drawings depict only typical embodiments thereof and are not therefore to be considered to be limiting of its scope, exemplary embodiments will be described and explained with additional specificity and detail through the use of the accompanying drawings in which:

FIG. 2B is a reverse perspective view of the exemplary inspection tool according to FIG. 2A;

FIG. 3 is an exploded view of a male connecting portion of the exemplary inspection tool according to FIGS. 2A and 2B; and, FIG. 4 shows stages of an exemplary method for measuring physical and electrical parameters of a perforating gun segment.

Figure 1:
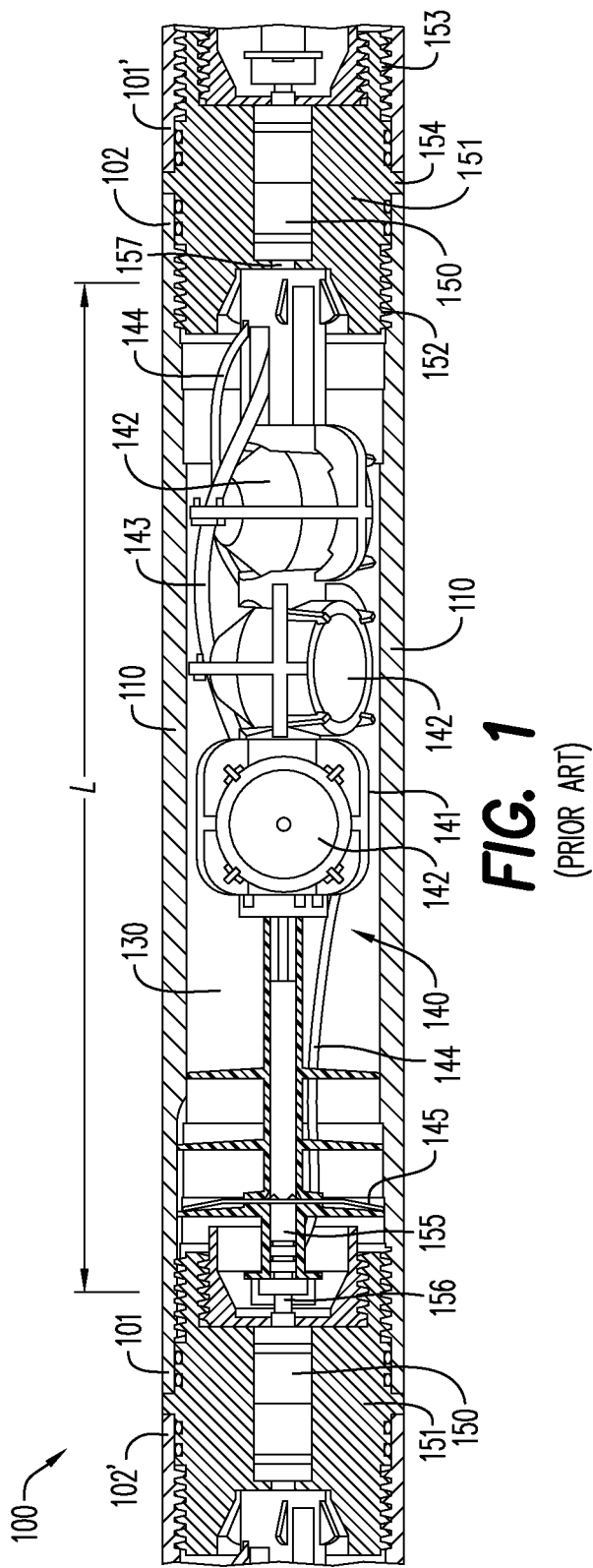
FIG. 1 is a cutaway view of a perforating gun segment according to the prior art.

Various features and aspects of the exemplary embodiments will become more apparent from the following detailed description, along with the accompanying figures in which like numerals represent like components throughout the figures and text. The various described features are not necessarily drawn to scale but are drawn to emphasize specific features relevant to some embodiments.

The headings used herein are for organizational purposes only and are not meant to limit the scope of the description or the claims. To facilitate understanding, reference numerals have been used, where possible, to designate like elements common to the figures.

DETAILED DESCRIPTION

Reference will now be made in detail to exemplary embodiments. Each example is provided by way of explanation and is not meant as a limitation and does not constitute a definition of all possible embodiments.

Figure 2A:
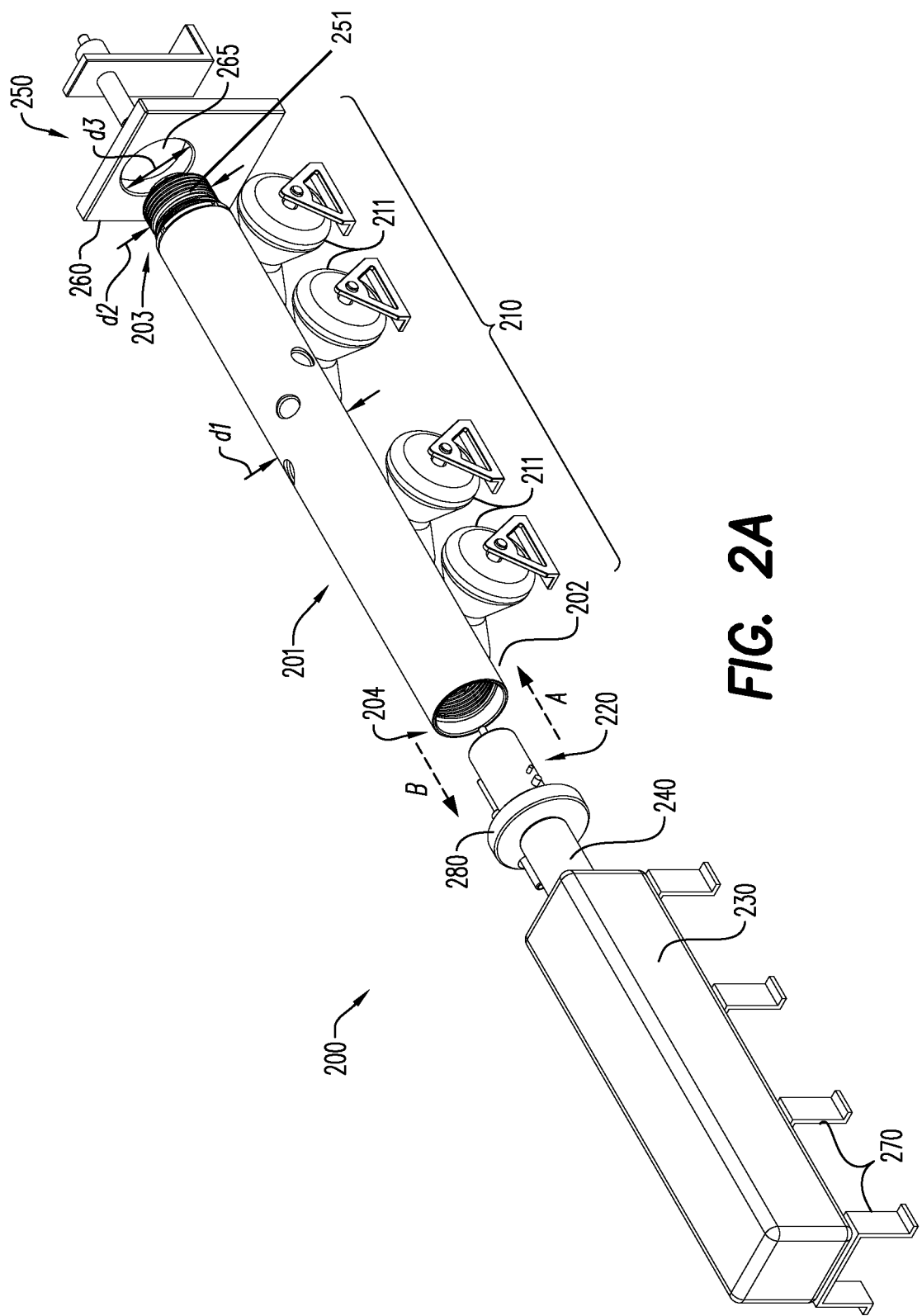
FIG. 2A is a perspective view of an inspection tool according to an exemplary embodiment.

With reference to FIGS. 2A and 2B, an exemplary inspection tool 200 for a perforating gun segment 201 is shown. In the exemplary embodiment shown in FIGS. 2A and 2B, the perforating gun segment 201 is received by a perforating gun segment holder 210, which in the exemplary embodiment is a plurality of supportive rollers 211 which both support the perforating gun segment 201 in an appropriate position with respect to other components (discussed below) of the inspection tool 200 and allow the perforating gun segment 201 to freely and easily move laterally as part of an exemplary method (discussed below with reference to FIG. 4) for measuring the physical and electrical parameters of the perforating gun segment 201.

Continuing with reference to FIGS. 2A and 2B, a top end 202 of the perforating gun segment 201 is positioned nearest to a male connecting portion 220 of the inspection tool 200 and a bottom end 203 of the perforating gun segment 201 is positioned nearest to a female connecting portion 250 of the inspection tool 200 when the perforating gun segment 201 is received in the perforating gun segment holder 210. The male connecting portion 220 is connected via a piston rod 240 to a piston 230 that is configured for moving the male connecting portion 220 in a first direction A towards the top end 202 of the perforating gun segment 201 and in a second direction B away from the top end 202 of the perforating gun segment 201 in accordance with an exemplary method described further below. The piston 230 may be supported on piston feet 270 to align the piston rod 240 and the male connecting portion 220 with the appropriate portions of the perforating gun segment 201. In an exemplary embodiment, the male connecting portion 220 and the piston rod 240 may be an integral structure. In other embodiments, the male connecting portion 220 and the piston rod 240 may be separate components joined by welding, mating components, threaded connections, or any technique or configuration consistent with this disclosure. For purposes of this disclosure and with reference to FIGS. 2A and 2B and FIG. 3, the male connecting portion 220 refers generally to a structure including one or more of a feedthrough connection 310, a ground bar connection 320, and a first distance sensor 330, while the piston rod 240 refers generally to a structure that moves the male connecting portion 220 and associated components, e.g., 310, 320, 330, by the action of the piston 230.

Figure 4:
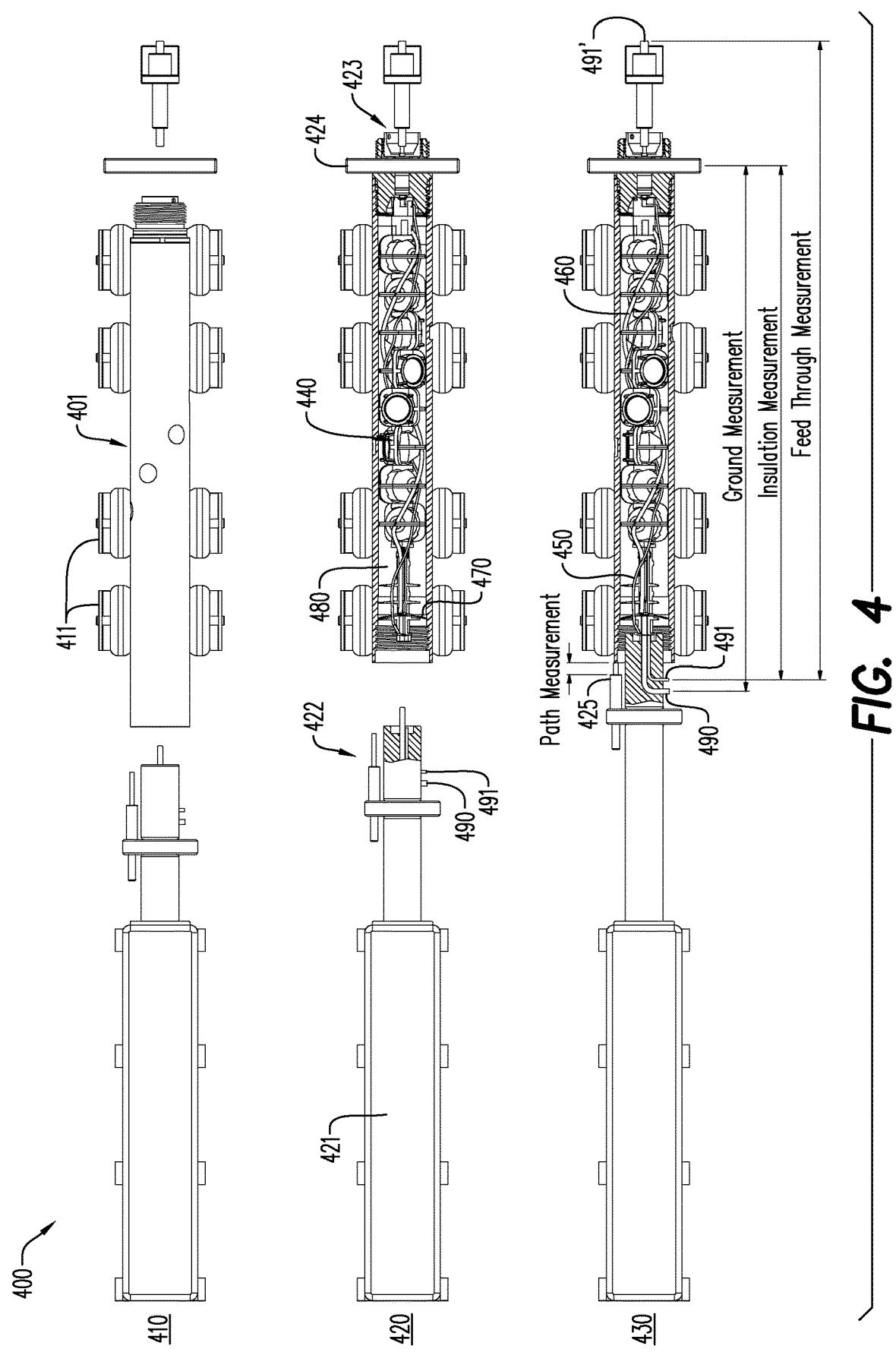

In an aspect, with continuing reference to FIGS. 2A and 2B and further reference to FIG. 3, an abutment plate 280 circumscribes at least a portion of at least one of the male connecting portion 220 and the piston rod 240. The abutment plate 280 according to the exemplary embodiment(s) shown in FIGS. 2A and 2B and FIG. 3 includes a distance sensor fixture 331 from which the first distance sensor 330 extends in a configuration for contacting a surface 332 of an annular face 204 of the perforating gun segment 201 when the male connecting portion 220 is advanced towards the top end 202 of the perforating gun segment 201 and pushes, under the force of the piston 230, the internal gun assembly 440 (FIG. 4) within a hollow interior 480 (FIG. 4) of the perforating gun segment 201 in accordance with the exemplary method described below with respect to FIG. 4. The first distance sensor 330 may measure a distance within the hollow interior 480 to which the internal gun assembly 440 and/or male connecting portion 220 is advanced under the pushing force of the piston 230. In the exemplary embodiments, the first distance sensor 330 may be a transducer or a mechanical pin. In other embodiments, the first distance sensor 330 may be any device in any configuration consistent with this disclosure for measuring a distance that the male connecting portion 220 and/or the internal gun assembly 440 travels with respect to the perforating gun segment 201. The first distance sensor 330 may measure the distance within the hollow interior 480 to which the male connecting portion 220/internal gun assembly 440 is advanced for determining whether the internal gun assembly 440 is positioned at a desired reference point representing a proper positioning of the internal gun assembly 440 within the hollow interior 480 of the perforating gun segment 201, 401 (FIG. 4). The reference point may be, for example and without limitation, a point or position along the length of the perforating gun segment 201, 401 or within the hollow interior 480 at which a portion of the internal gun assembly 440 should be located in a proper configuration. Any number of reference points may be used—for example, a "top" reference point may refer to a reference point nearest the top end 202 of the perforating gun segment 201 while a "bottom" reference point may be nearest the bottom end 203 of the perforating gun segment 201. In an embodiment where the female connecting portion 250 includes a distance sensor in addition to or instead of the first distance sensor, as described below, the distance sensor of the female connecting portion 250 may also measure the position of the internal gun assembly 440 with respect to one or more reference points. In the disclosed or other embodiments, a device for directly measuring a distance between the internal gun assembly 440 and the reference point(s) may be used in conjunction with or instead of the first distance sensor 330. An exemplary device for directly measuring such distance may be, for example and without limitation, an optical sensor.

With further reference to the exemplary embodiment of the inspection tool 200 shown in FIGS. 2A and 2B, the female connecting portion 250 of the inspection tool 200 is adjacent to the bottom end 203 of the perforating gun segment 201 when the perforating gun segment 201 is received by the perforating gun segment holder 210. In the exemplary embodiments, the female connecting portion 250 includes a pin contact point 290 that serves both as an electrical contact for one or more components of the internal gun assembly 440, such as a conductive line 450 (FIG. 4) or a detonating cord 460 including a conductive line (for example, a conductive detonating cord as described in U.S. Patent Application No. 62/683,083 filed Jun. 11, 2018, which is incorporated by reference herein in its entirety), and a second distance sensor for measuring a distance that the internal gun assembly 440 travels under the pushing force of the piston 230 after making electrical contact with the pin contact point 290. The second distance sensor may be a transducer, mechanical pin, or other component as discussed with respect to the first distance sensor 330. In the same or other embodiments, one or more separate components of the female connecting portion 250 may include a device for measuring at least one of the distance that the internal gun assembly 440 travels under the pushing force of the piston 230 after making electrical contact with the pin contact point 290, a gross distance that the internal gun assembly 440 travels under the pushing force of the piston 230, and a distance between the internal gun assembly 440 and, e.g., a bottom reference point of the perforating gun segment 201 as described above with respect to the first distance sensor 330.

In an aspect, the exemplary inspection tool 200 also includes an alignment plate 260 positioned between the perforating gun segment 201 and the female connecting portion 250. The alignment plate 260 includes an aperture 265 configured for receiving, positioning, and supporting the perforating gun segment 201 adjacent to the female connecting portion 250 as shown and described with respect to FIG. 4. With reference back to FIGS. 2A and 2B, the bottom end 203 of the perforating gun segment 201 is threadingly connected to a tandem sub 251. The tandem sub 251 has an outside diameter d2 that is less than an outside diameter d1 of the perforating gun segment 201. In the exemplary embodiment shown in FIGS. 2A and 2B, the aperture 265 is substantially circular and has a diameter d3 configured for receiving the tandem sub 251 through the aperture 265 such that the alignment plate 260 abuts a portion of the perforating gun segment 201 and thereby prevents the perforating gun segment 201 from moving past a certain distance from the female connecting portion 250. The arrangement of the perforating gun segment 201, alignment plate 260, and female connecting portion 250 is further described below with respect to FIG. 4.

With reference now to FIG. 3, an exploded view of the exemplary male connecting portion 220 is shown. The male connecting portion 220 includes the feedthrough connection 310, the ground bar connection 320, and the first distance sensor 330. In operation, and as described below in the exemplary method with respect to FIG. 4, the feedthrough connection 310 is configured for making electrical contact with a feedthrough conductor such as a conductive line 450 or conductive detonating cord 460 in the perforating gun segment 201 when the male connecting portion 220 is advanced by the piston 230 into contact with the internal gun assembly 440. The ground bar connection 320 is configured for making electrical contact with a ground contact (145, FIG. 1) such as, for example and without limitation, a ground wire, a ground spring, a stamped sheeted metal ground contact (such as, e.g., a ground bar), or an integrated ground contact on a detonator (for example, as described in U.S. Pat. No. 9,605,937 issued Mar. 28, 2017 and U.S. Pat. No. 9,581,422 issued Feb. 28, 2017, the disclosure of each of which is incorporated herein by reference in their entirety). The first distance sensor 330 is configured for contacting the surface 332 of the perforating gun segment 201 as described above. The surface 332 of the perforating gun segment 201 in the exemplary embodiments shown in FIGS. 2A and 2B and FIG. 3 is on the annular face 204 of the perforating gun segment 201. In other embodiments, a distance sensor on the male connecting portion 220 may contact any portion of the perforating gun segment 201, including the internal gun assembly 440, or may be a free-operating device such as an accelerometer depending on the type and configuration of the distance sensor, perforating gun segment, and desired configuration of the inspection tool 200 and associated inspection method.

In a further aspect of the exemplary embodiments, the first distance sensor 330, the pin contact point 290, and/or one or more separate components of at least one of the male connecting portion 220, the piston 230, and the female connecting portion 250 may be configured for measuring an amount of pushing force or pressure that the piston 230 applies to the internal gun assembly 440. For example and without limitation, the pushing force or pressure may be measured by a transducer or a biasing mechanism configured for measuring the pushing force/pressure as a function of the degree to which the biasing forces are overcome. In one aspect, the pushing force/pressure may be controlled so as to not damage the internal gun assembly 440 or inspection tool components. In another aspect, a position of the internal gun assembly 440 may be determined according to the applied force/pressure by, e.g., detecting a change in the applied force/pressure when the internal gun assembly 440 makes contact with the male connecting portion 220 and/or the pin contact point 290, and/or according to the applied force/pressure that may be required to, e.g., advance the internal gun assembly 440 such that a distance sensor registers movement of the internal gun assembly 440.

With reference now to FIG. 4, a method 400 for inspecting a perforating gun segment 401 according to the exemplary disclosed embodiments is illustrated. At step 410, a perforating gun segment 401 is placed into a perforating gun segment holder 210 (FIGS. 2A and 2B) including rollers 411 according to the exemplary disclosed embodiments. At step 420, the perforating gun segment 401 has been moved, for example, manually, through an aperture (265, FIGS. 2A and 2B) in an alignment plate 424 such that a portion of the perforating gun segment 401 is adjacent to a female connecting portion 423. As previously discussed with respect to the exemplary embodiment shown in FIGS. 2A and 2B, the exemplary rollers 211 allow free and easy movement of the perforating gun segment 201 on the perforating gun segment holder 210, such that the perforating gun segment 401 shown in FIG. 4 may be manually moved into the position shown in step 420. Also as previously discussed with respect to FIGS. 2A and 2B, the aperture 265 has a diameter such that a tandem sub 251 that is threadingly connected to a bottom end 203 of the perforating gun segment 201 is received by the aperture 265 while the alignment plate 260 abuts a portion of the perforating gun segment 201 and thereby prevents the perforating gun segment 201 from moving past a certain distance from the female connecting portion 250. With reference back to FIG. 4, the perforating gun segment 401 at step 420 has been moved accordingly so as to abut the alignment plate 424. Rollers 411 allow the perforating gun segment 401 to be freely and easily moved laterally into position with respect to the female connecting portion 423. As also shown in step 420, a piston 421 advances a male connecting portion 422, according to the exemplary disclosed embodiments, towards the perforating gun segment 401 (i.e., in a direction A (FIG. 2A)).

At step 430, a feedthrough connection according to the exemplary disclosed embodiments of the male connecting portion 422 is placed into electrical contact with a feedthrough conductor, such as the conductive line 450 or a conductive detonating cord 460 of the perforating gun segment 401, as the internal gun assembly 440 is correspondingly pushed by the male connecting portion 422, under the force of the piston 421, to a position within the hollow interior 480 of the perforating gun segment 401. Also at step 430, a ground bar connection according to the exemplary disclosed embodiments of the male connecting portion 422 is placed into electrical contact with a ground contact 470 as described above and a first distance sensor 425 according to the exemplary disclosed embodiments of the male connecting portion 422 is placed into contact with a portion of the perforating gun segment 401. In the exemplary method shown in FIG. 4, the first distance sensor 425 measures a distance to which the male connecting portion 422 advances after the first distance sensor 425 makes contact with the portion of the perforating gun segment 401.

The abutting relationship of the perforating gun segment 401 and the alignment plate 424 prevents the perforating gun segment 401 (excluding the internal gun assembly 440 which is pushed within the hollow interior 480 of the perforating gun segment 401) from further lateral movement under the force of the piston 421 as applied to the first distance sensor 425 and the internal gun assembly 440. According to the exemplary disclosed embodiments, the first distance sensor 425 may also function as a force or pressure sensor for determining an amount of force or pressure that the piston 421 exerts on the internal gun assembly 440.

Step 430 further shows that the internal gun assembly 440 is pushed to a position at which a feedthrough connection such as a pin contact point 290 according to the exemplary disclosed embodiments of the female connecting portion 423 is placed into electrical contact with the feedthrough conductor 450. According to the exemplary disclosed embodiments, the feedthrough connection of the female connecting portion 423 may also function as a second distance sensor for measuring a distance to which the internal gun assembly 440 advances after the feedthrough connection of the female connecting portion 423 contacts the internal gun assembly 440. In addition, the feedthrough connection/second distance sensor may also serve as a force or pressure sensor for determining an amount of force or pressure that the piston 421 exerts on the internal gun assembly 440.

With continuing reference to the exemplary method illustrated in FIG. 4, the internal gun assembly 440 is moved to a desired position (e.g., according to one or more reference points of the perforating gun segment 401) within the hollow interior 480 of the perforating gun segment 401 as determined by the first distance sensor, second distance sensor, and/or one or more force/pressure sensors. Once the internal gun assembly 440 is in the desired position, the inspection tool may measure electrical properties of the perforating gun segment 401 to ensure, among other things, that the proper electrical connections are made with the internal gun assembly 440 at the desired position. For example, the respective feedthrough connections of the male connecting portion 422 and the female connecting portion 423 are together configured to measure a feedthrough resistance of the feedthrough conductor 450. In an aspect, a voltage may be applied between the feedthrough connector of the male connecting portion 422 and the feedthrough connector of the female connecting portion 423 via respective feedthrough leads 491, 491' of the male connecting portion 422 and the female connecting portion 423, wherein the respective feedthrough leads 491, 491' are electrically connected to the corresponding feedthrough connections of the male connecting portion 422 and the female connecting portion 423. The feedthrough resistance measurement is for ensuring that the resistance across the feedthrough conductor 450 is below a certain threshold for effectively relaying an electrical signal between respective electrical contacts at the top end and the bottom end of the perforating gun segment 401/internal gun assembly 440.

In another aspect, a ground contact resistance of the ground contact 470 may be measured by applying a voltage between the ground bar connection and a portion of a metal body (e.g., gun carrier 110 (FIG. 1)) of the perforating gun segment 401 or the alignment plate 424 with which the metal body is in electrically conductive contact, via a ground lead 490 which is in electrical contact with the ground bar connection and an electrical contact at the portion of the perforating gun segment 401 or the alignment plate 424. The ground contact resistance measurement is for ensuring that the resistance across the ground contact 470 is below a certain threshold for an effective ground connection of the perforating gun segment 401.

In a further aspect according to the exemplary method shown in FIG. 4, an insulation resistance between the feedthrough conductor 450 and the ground contact 470 may be measured by applying a voltage between the feedthrough connection of the male connecting portion 422 and a portion of the metal body of the perforating gun segment 401/alignment plate 424 as described above. The insulation resistance measurement is for verifying that the resistance between the feedthrough conductor 450 and the ground contact 470 (via the metal body of the perforating gun segment 401) is above a certain threshold that would indicate a short circuit between the feedthrough conductor 450 and the ground contact 470 of the internal gun assembly 440 within the hollow interior 480 of the perforating gun segment 401.

In the event that the above (and/or other) measurements are taken according to the method described with respect to FIG. 4 and all of the measurements are within defined quality specifications, the exemplary method may further include moving with the piston 421 the male connecting portion 422 in a direction (i.e., direction B (FIG. 2A)) away from the perforating gun segment 401 and out of contact with the internal gun assembly 440. The perforating gun segment 401 may then be moved out of and away from the aperture and the alignment plate 424 and removed from the perforating gun segment holder.

In the event that any measurements taken according to the exemplary method are outside of defined quality specifications, the exemplary method may further include locking, under the force of the piston 421, the internal gun assembly 440 within the hollow interior 480 of the perforating gun segment 201. For example, if any of the feedthrough resistance, ground contact resistance, insulation resistance, or distance measurements with respect to the position of the internal gun assembly 440 within the hollow interior 480 of the perforating gun segment 201 are outside of such specifications, the piston 421 will lock the internal gun assembly 440 at its current position. The inspection system may log the errant measurement(s) associated with the particular perforating gun segment 201 and the internal gun assembly 440 may remain locked until the errant measurement(s) are acknowledged, for example, by an operator. Once the errant measurement(s) are acknowledged, the piston 421 may release the internal gun assembly 440 and the perforating gun segment 201 may be removed as described above.

As discussed above, the distance(s) measured with respect to the position of the internal gun assembly 440 may vary in alternative embodiments. For example, the distance measurement may be a displacement of the internal gun assembly 440 respectively from the top end 202 and the bottom end 203 of the perforating gun segment 201. The distance measurement may be a distance of the internal gun assembly 440 relative to one or more reference points on the perforating gun segment 201 or within the hollow interior 480. The distance measurement may be a degree of travel by one or more distance sensors at one or both of the male connection portion 220 and the female connecting portion 250.

The applicable threshold resistances for each of the above measurements may vary according to a variety of factors including the design and application requirements for particular perforating guns. In addition, the various measurements discussed above are exemplary and not limiting. Other physical and electrical properties of a perforating gun segment may be measured using appropriate measurement tools and configurations consistent with the exemplary embodiments of an inspection tool disclosed herein.

In another aspect of the exemplary devices, systems, and methods disclosed herein, information regarding a particular perforating gun segment undergoing inspection and corresponding inspection parameters may be input, displayed, configured, and/or stored, and operation of the inspection tool may be controlled, via a system including, for example and without limitation, a user interface, a visual display, a processor, and one or more electronic storage mediums. An exemplary user interface may include an input device such as a keyboard, mouse, touchscreen, keypad, and the like for allowing a user to manually input information regarding the perforating gun segment undergoing inspection. The information may include, for example and without limitation, an identity, type, application, etc. of the perforating gun segment. The user interface may also include an automated or semi-automated input system such as a radio frequency identification (RFID) tag, barcode, and the like that is scanned manually by a user or automatically by the inspection tool or a separate component with a corresponding scanner or reader when, e.g., the perforating gun segment is placed in the perforating gun segment holder. In the case of automatic scanning, the scanner or reader would be on or near the inspection tool and configured for allowing the scanner/reader to activate or scan the RFID tag or barcode, for example.

The user interface may further include a control system for manually controlling operation of the inspection tool, wherein controlling operation of the inspection tool may include, for example and without limitation, initiating one or more aspects of the inspection method, providing an emergency stop for the inspection, adjusting an operating parameter of a component of the inspection tool, etc.

The visual display may include, for example and without limitation, a monitor, gauge, and the like for presenting to a user information regarding the perforating gun segment, inspection progress, measurement results, etc. Accordingly, a user may view and verify in real time the inspection procedure and results. The visual display and user interface together may be further configured for, e.g., adjusting the presentation of information on the visual display and inputting additional information or notes regarding the inspection.

The processor may include any known programmable circuitry. The processor may, for example, adjust the inspection parameters and/or measurement thresholds according to input information regarding the particular perforating gun segment undergoing inspection and/or automatically control operation of one or more aspects of the inspection method and system as described above with respect to the user interface. The processor may also control the visual display as discussed above.

The electronic storage medium may include, for example and without limitation, non-volatile random access memory (NVRAM), dynamic memory such as main memory or hard drive memory, a hard disk, RAM, PROM, EPROM, FLASH-EPROM, memory chip or cartridge, or any other medium with which a computer can read and/or write. The electronic storage medium may be incorporated in one or more of a local device such as a desktop/laptop computer at the inspection station, a remote device such as a central server, or a virtual platform such as cloud storage. The electronic storage medium may communicate with one or more of the user interface, display, and processor for associating and storing retrievable information about each perforating gun segment, inspection, measurement result, operator, etc.

The present disclosure, in various embodiments, configurations and aspects, includes components, methods, processes, systems and/or apparatuses substantially developed as depicted and described herein, including various embodiments, sub-combinations, and subsets thereof. Those of skill in the art will understand how to make and use the present disclosure after understanding the present disclosure. The present disclosure, in various embodiments, configurations and aspects, includes providing devices and processes in the absence of items not depicted and/or described herein or in various embodiments, configurations, or aspects hereof, including in the absence of such items as may have been used in previous devices or processes, e.g., for improving performance, achieving ease and/or reducing cost of implementation.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

In this specification and the claims that follow, reference will be made to a number of terms that have the following meanings. The terms "a" (or "an") and "the" refer to one or more of that entity, thereby including plural referents unless the context clearly dictates otherwise. As such, the terms "a" (or "an"), "one or more" and "at least one" can be used interchangeably herein. Furthermore, references to "one embodiment", "some embodiments", "an embodiment" and the like are not intended to be interpreted as excluding the existence of additional embodiments that also incorporate the recited features. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Terms such as "first," "second," "upper," "lower" etc. are used to identify one element from another, and unless otherwise specified are not meant to refer to a particular order or number of elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

As used in the claims, the word "comprises" and its grammatical variants logically also subtend and include phrases of varying and differing extent such as for example, but not limited thereto, "consisting essentially of" and "consisting of." Where necessary, ranges have been supplied, and those ranges are inclusive of all sub-ranges therebetween. It is to be expected that variations in these ranges will suggest themselves to a practitioner having ordinary skill in the art and, where not already dedicated to the public, the appended claims should cover those variations.

The terms "determine", "calculate" and "compute," and variations thereof, as used herein, are used interchangeably and include any type of methodology, process, mathematical operation or technique.

The foregoing discussion of the present disclosure has been presented for purposes of illustration and description. The foregoing is not intended to limit the present disclosure to the form or forms disclosed herein. In the foregoing Detailed Description for example, various features of the present disclosure are grouped together in one or more embodiments, configurations, or aspects for the purpose of streamlining the disclosure. The features of the embodiments, configurations, or aspects of the present disclosure may be combined in alternate embodiments, configurations, or aspects other than those discussed above. This method of disclosure is not to be interpreted as reflecting an intention that the present disclosure requires more features than are expressly recited in each claim. Rather, as the following claims reflect, the claimed features lie in less than all features of a single foregoing disclosed embodiment, configuration, or aspect. Thus, the following claims are hereby incorporated into this Detailed Description, with each claim standing on its own as a separate embodiment of the present disclosure.

Advances in science and technology may make equivalents and substitutions possible that are not now contemplated by reason of the imprecision of language; these variations should be covered by the appended claims. This written description uses examples to disclose the method, machine and computer-readable medium, including the best mode, and also to enable any person of ordinary skill in the art to practice these, including making and using any devices or systems and performing any incorporated methods. The patentable scope thereof is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. An inspection tool for a perforating gun segment, comprising:
   a first connecting portion;
   a second connecting portion positioned opposite the first connecting portion in a spaced apart relationship from the first connecting portion;
   a perforating gun segment holder positioned between the first connecting portion and the second connecting portion and dimensioned for receiving the perforating gun segment including a gun carrier;
   at least one electrical testing contact positioned on at least one of the first connecting portion and the second connecting portion; and
   a distance sensor positioned on at least one of the first connecting portion and the second connecting portion, wherein
   the at least one electrical testing contact is positioned for making electrical contact with an electrical contact component of the perforating gun segment, and the distance sensor is positioned for making physical contact with a distance sensor contact point on the perforating gun segment, when the perforating gun segment is received in the perforating gun segment holder.

2. The inspection tool of claim 1, further comprising:
   a piston having a piston rod, wherein
   the first connecting portion is connected to the piston rod and moveable, via the piston, between a first position and a second position, and
   the at least one electrical testing contact and the distance sensor are positioned respectively for making electrical contact with the electrical contact component and making physical contact with the distance sensor contact point when the first connecting portion is in the second position.

3. The inspection tool of claim 2, wherein the distance sensor is positioned on the first connecting portion, wherein a portion of a distance between the first position and the second position is a distance that an internal gun assembly within the gun carrier of the perforating gun segment is moved by the first connecting portion moving from the first position to the second position after the distance sensor contacts the distance sensor contact point.

4. The inspection tool of claim 3, wherein the distance sensor contact point is on the gun carrier.

5. The inspection tool of claim 3, wherein a position within the gun carrier to which the internal gun assembly is moved by the first connecting portion in the second position is a predetermined position for the internal gun assembly.

6. The inspection tool of claim 3, further comprising a sensor operative to measure a force exerted by the piston on the internal gun assembly.

7. The inspection tool of claim 2, wherein the distance sensor is positioned on the second connecting portion, wherein a portion of a distance between the first position and the second position is a distance that an internal gun assembly within a gun carrier of the perforating gun segment is moved by the first connecting portion moving from the first position to the second position after the distance sensor contacts the distance sensor contact point, wherein the distance sensor contact point is on the internal gun assembly.

8. The inspection tool of claim 2, wherein the at least one electrical testing contact includes a first electrical testing contact positioned on the first connecting portion and a second electrical testing contact positioned on the second connecting portion, wherein the first electrical testing contact is in electrical contact with a first end of a feedthrough conductor of the perforating gun segment and the second electrical testing contact is in electrical contact with a second end of the feedthrough conductor when the first connecting portion is in the second position.

9. The inspection tool of claim 8, wherein the feedthrough conductor is a conductive line or a conductive detonating cord.

10. The inspection tool of claim 8, wherein the at least one electrical testing contact includes a third electrical testing contact positioned on the first connecting portion, wherein the third electrical testing contact is in electrical contact with a ground contact of the perforating gun segment when the first connecting portion is in the second position.

11. A method for measuring at least one electrical property and a dimension of a perforating gun segment before the perforating gun segment is sent to a wellbore site, the method comprising:
   positioning the perforating gun segment between a first connecting portion and a second connecting portion, wherein at least one electrical testing contact is positioned on at least one of the first connecting portion and the second connecting portion and a distance sensor is positioned on at least one of the first connecting portion and the second connecting portion, wherein the at least one electrical testing contact and the distance sensor are positioned respectively for making electrical contact with an electrical contact component of the perforating gun segment and making physical contact with a distance sensor contact point on the perforating gun segment;

actuating the first connecting portion to move from a first position to a second position, wherein the at least one electrical testing contact and the distance sensor are respectively in electrical contact with the electrical contact component of the perforating gun segment and in physical contact with the distance sensor contact point when the first connecting portion is in the second position; and, measuring the at least one electrical property of the perforating gun segment when the first electrical testing contact is in electrical contact with the electrical contact component, and a distance that the first connecting portion travels after the distance sensor contacts the distance sensor contact point.

12. The method of claim 11, further comprising pushing with the first connecting portion an internal gun assembly within a gun carrier of the perforating gun segment.

13. The method of claim 12, wherein measuring the distance includes measuring a distance between the first position and the second position that the first connecting portion travels after the distance sensor contacts the distance sensor contact point, wherein the internal gun assembly is pushed to a predetermined position within the gun carrier, as measured by the distance sensor.

14. The method of claim 12, further comprising measuring a force exerted by the first connecting portion on the internal gun assembly while the first connecting portion is pushing the internal gun assembly.

15. The method of claim 11, wherein the at least one electrical testing contact includes a first electrical testing contact positioned on the first connecting portion and a second electrical testing contact positioned on the second connecting portion, wherein the first electrical testing contact is electrically connected to a first end of a feedthrough conductor of the perforating gun segment and the second electrical testing contact is electrically connected to a second end of the feedthrough conductor when the first connecting portion is in the second position, and measuring the at least one electrical property includes measuring a feedthrough resistance of the feedthrough conductor.

16. The method of claim 15, wherein the at least one electrical testing contact includes a third electrical testing contact positioned on the first connecting portion, wherein the third electrical testing contact is in electrical contact with a ground contact of the perforating gun segment when the first connecting portion is in the second position, and measuring the at least one electrical property includes measuring a ground contact resistance.

17. A method for measuring electrical properties and dimensions of a perforating gun segment, the method comprising:
positioning the perforating gun segment between a first connecting portion and a second connecting portion, wherein the first connecting portion includes a first electrical testing contact and the second connecting portion includes a second electrical testing contact, and a distance sensor is positioned on at least one of the first connecting portion and the second connecting portion;

actuating the first connecting portion to move from a first position to a second position, wherein, during the first connecting portion moving from the first position to the second position, the distance sensor contacts a distance sensor contact point on the perforating gun segment and the first electrical testing contact electrically contacts a first end of a feedthrough conductor of an internal gun assembly within a gun carrier of the perforating gun segment;

pushing with the first connecting portion the internal gun assembly to a predetermined position within the gun carrier, wherein the distance sensor measures a distance that the first connecting portion travels from the first position to the second position after the distance sensor contacts the distance sensor contact point, and the predetermined position of the internal gun assembly corresponds to a preset distance that the first connecting portion travels after the distance sensor contacts the distance sensor contact point, wherein the second electrical testing contact electrically contacts a second end of the feedthrough conductor when the internal gun assembly is in the predetermined position; and, measuring a feedthrough resistance of the feedthrough conductor.

18. The method of claim 17, wherein the first connecting portion includes a third electrical testing contact, and the third electrical testing contact electrically contacts a ground contact of the internal gun assembly during the first connecting portion moving from the first position to the second position, and the method further comprises measuring a ground contact resistance of the internal gun assembly.

19. The method of claim 18, further comprising locking the perforating gun segment between the first connecting portion and the second connecting portion by disabling an actuation of the first connecting portion to move from the second position to the first position, if the internal gun assembly is not at the predetermined position or either of the feedthrough resistance or the ground contact resistance is outside of a respective predetermined range.

20. The method of claim 19, further comprising
acknowledging, via a controller operative to receive the acknowledgement and control actuation of the first connecting portion, that the internal gun assembly is not at the predetermined position, the feedthrough resistance is outside of the predetermined feedthrough resistance range, or the ground contact resistance is outside of the predetermined ground contact resistance range; and,
unlocking the perforating gun segment in response to the acknowledgement by enabling the actuation of the first connecting portion to move from the second position to the first position; and,
actuating the first connecting portion to move from the second position to the first position.

* * * * *